(12) United States Patent
Purser et al.

(10) Patent No.: US 8,993,980 B1
(45) Date of Patent: Mar. 31, 2015

(54) DUAL STAGE SCANNER FOR ION BEAM CONTROL

(71) Applicant: Varian Semiconductor Equipment Associates, Inc., Gloucester, MA (US)

(72) Inventors: Kenneth H. Purser, Gloucester, MA (US); Christopher Campbell, Newburyport, MA (US); Frank Sinclair, Boston, MA (US); Robert C. Lindberg, Rockport, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/163,833

(22) Filed: Jan. 24, 2014

Related U.S. Application Data

(60) Provisional application No. 61/894,065, filed on Oct. 22, 2013.

(51) Int. Cl.
*H01J 37/147* (2006.01)
*H01J 37/317* (2006.01)

(52) U.S. Cl.
CPC .................. *H01J 37/1475* (2013.01)
USPC .............. 250/398; 250/396 R; 250/492.3; 250/492.21

(58) Field of Classification Search
CPC ................. H01J 3/26; H01J 3/28; H01J 3/30; H01J 3/32; H01J 37/02; H01J 37/04; H01J 37/147; H01J 37/1471; H01J 37/1472; H01J 37/1474; H01J 37/1475; H01J 37/1477; H01J 37/153; H01J 37/3171; H01J 37/3172
USPC .............. 250/396 R–396 ML, 492.2, 492.21, 250/492.3
See application file for complete search history.

(56) References Cited

U.S. PATENT DOCUMENTS

| 4,276,477 A | 6/1981 | Enge |
| 5,012,104 A | 4/1991 | Young |

(Continued)

FOREIGN PATENT DOCUMENTS

| EP | 0473097 A2 | 3/1992 |

OTHER PUBLICATIONS

Glavish, et al., "Fast Magnetic Scanning and Ion Optical Features of the New Ibis Oxygen Implanter," ION Implantation Technology, 1993, vol. 92, p. 397-400.

(Continued)

*Primary Examiner* — Jack Berman
*Assistant Examiner* — David E Smith

(57) ABSTRACT

An ion beam scanner includes a first scanner stage having a first opening to transmit an ion beam, the first scanner stage to generate, responsive to a first oscillating deflection signal, a first oscillating deflecting field within the first opening; a second scanner stage disposed downstream of the first scanner stage and having a second opening to transmit the ion beam, the second scanner stage to generate, responsive to a second oscillating deflection signal, a second oscillating deflecting field within the second opening that is opposite in direction to the first oscillating deflecting field, and a scan controller to synchronize the first oscillating deflection signal and second oscillating deflection signal to generate a plurality of ion trajectories when the scanned ion beam exits the second stage that define a common focal point.

18 Claims, 6 Drawing Sheets

(56) References Cited

U.S. PATENT DOCUMENTS

| | | | |
|---|---|---|---|
| 5,132,544 A | 7/1992 | Glavish | |
| 5,151,605 A * | 9/1992 | Politiek et al. | 250/492.2 |
| 5,216,253 A | 6/1993 | Koike | |
| 5,438,203 A | 8/1995 | Glavish et al. | |
| 5,483,077 A | 1/1996 | Glavish | |
| 6,207,963 B1 | 3/2001 | Benveniste | |
| 6,573,517 B1 * | 6/2003 | Sugitani et al. | 250/492.21 |
| 6,933,507 B2 | 8/2005 | Purser et al. | |
| 7,301,156 B2 | 11/2007 | Purser et al. | |
| 2005/0017199 A1 | 1/2005 | Roh | |
| 2007/0125955 A1 | 6/2007 | Low et al. | |
| 2008/0042074 A1 * | 2/2008 | Sato et al. | 250/396 R |
| 2008/0067442 A1 * | 3/2008 | Vanderberg et al. | 250/492.21 |
| 2008/0078952 A1 | 4/2008 | Gupta et al. | |
| 2009/0032726 A1 | 2/2009 | Sieradzki et al. | |
| 2009/0084757 A1 | 4/2009 | Erokhin et al. | |
| 2009/0154650 A1 * | 6/2009 | Tanabe | 378/137 |
| 2009/0166566 A1 * | 7/2009 | Gupta et al. | 250/492.21 |
| 2009/0314958 A1 | 12/2009 | Tieger et al. | |
| 2010/0243879 A1 * | 9/2010 | Huang et al. | 250/281 |
| 2011/0108736 A1 * | 5/2011 | Preikszas | 250/397 |
| 2011/0272567 A1 * | 11/2011 | Eisner et al. | 250/252.1 |
| 2012/0126147 A1 | 5/2012 | Cherekdjian | |
| 2012/0298854 A1 | 11/2012 | Hanby et al. | |

OTHER PUBLICATIONS

International Search Report and Written Opinion Mailed Jan. 26, 2015 for PCT/US2014/060695 Filed Oct. 15, 2014.

International Search Report and Written Opinion Mailed Jan. 23, 2015 for PCT/US2014/060687 Filed Oct. 15, 2014.

International Search Report and Written Opinion Mailed Jan. 26, 2015 for PCT/US2014/060696 Filed Oct. 15, 2014.

* cited by examiner

DUAL STAGE SCANNER FOR ION BEAM CONTROL

RELATED APPLICATIONS

This application claims priority to U.S. Provisional Patent Application Ser. No. 61/894,065, filed Oct. 22, 2013.

FIELD

The present embodiments relate to ion beam apparatus, and more particularly, to scanners to control ion beams.

BACKGROUND

In the present day, ion implanters are often constructed to optimize implantation according to a specific set of applications. In current applications, for example, some beamline ion implanters are configured to generate high current ribbon beams in which the beam cross section that intercepts a substrate has a beam width that is much greater than the beam height. In some configurations the beam width is slightly larger than the size of a substrate at the substrate plane e.g., 200, 300, or 400 mm, while the beam height is on the order of 10 mm, 20 mm, or 30 mm, for example. By scanning the substrate with respect to the ribbon beam in the direction of the beam height, the entire substrate may be implanted by the ion beam.

For other ion implantation applications, it may be preferable to use a spot beam ion beam in which the beam height and beam width are more equal. One advantage afforded by spot beam ion implantation is the better control of dose uniformity afforded by spot beams. In a spot beam ion implantation application, the spot beam may be scanned along a first direction to cover the dimension of a substrate in that direction that is being implanted. At the same time, the substrate may be scanned in a direction perpendicular to that of the scan direction of the spot beam. The local ion dose concentration can be modified by adjusting the speed of the ion beam along the direction of spot beam scanning. This can be accomplished under computer control in a manner that allows the spot beam scanning to be carefully controlled to optimize ion dose uniformity.

In many beamline ion implanters, after exiting a mass resolving slit, the ion beam may propagate as a wide beam of diverging ions to a collimator, which form a collimated ion beam that is directed to the substrate being processed. In order to provide the correct collimation of the ion beam, the collimator is often set to collimate ions that originate from an object that is placed at the plane of the mass resolving slit (MRS). This feature makes it more difficult to operate the same beamline in both spot beam mode and ribbon mode. In ribbon beam mode, the ion trajectories generated by an analyzer magnet may focus at the MRS to fan out into the collimator situated downstream. However in a conventional ion implanter in a spot beam mode the ion beam may pass through the mass resolving slit as a small beam having more parallel ion trajectories. After exiting the mass resolving slit, the spot beam is then deflected back and forth in a scanner by a deflecting field oriented generally perpendicularly to the direction of propagation of the spot beam. This scanning of the spot beam forms a diverging fan of ion trajectories over time that enters the collimator. The object location in this spot beam configuration is within the scanner that is located downstream of the mass resolving slit. The object location of a spot beam generated from a scanner may therefore vary too much from the object location of a ribbon beam for a collimator to properly collimate both types of beams without extensive reconfiguration. Accordingly, it is common practice for a ribbon beam ion implanter to be employed for certain ion implantation steps or for certain substrates, such as high dose implantation, while a separate spot beam ion implanter is employed for other ion implantation steps that require better dose control. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an ion beam scanner includes a first scanner stage having a first opening to transmit an ion beam, the first scanner stage to generate, responsive to a first oscillating deflection signal, a first oscillating deflecting field within the first opening; a second scanner stage disposed downstream of the first scanner stage and having a second opening to transmit the ion beam, the second scanner stage to generate, responsive to a second oscillating deflection signal, a second oscillating deflecting field within the second opening that is opposite in direction to the first oscillating deflecting field, and a scan controller to synchronize the first oscillating deflection signal and second oscillating deflection signal to generate a plurality of ion trajectories when the scanned ion beam exits the second stage that define a common focal point.

In a further embodiment a ion implanter includes an ion source; beamline components to generate a spot ion beam; and a dual stage scan system operative to scan the spot ion beam over a plurality of ion trajectories to generate a scanned ribbon beam, wherein the dual stage scan system is operative to generate a first oscillating deflecting field at a first stage, and a second oscillating deflecting field at a second stage that is opposite in direction to the first oscillating deflecting field, and wherein the plurality of ion trajectories define a respective plurality of lines that converge at a focal point that is disposed upstream of the dual stage scan system.

DETAILED DESCRIPTION

Figure 1:
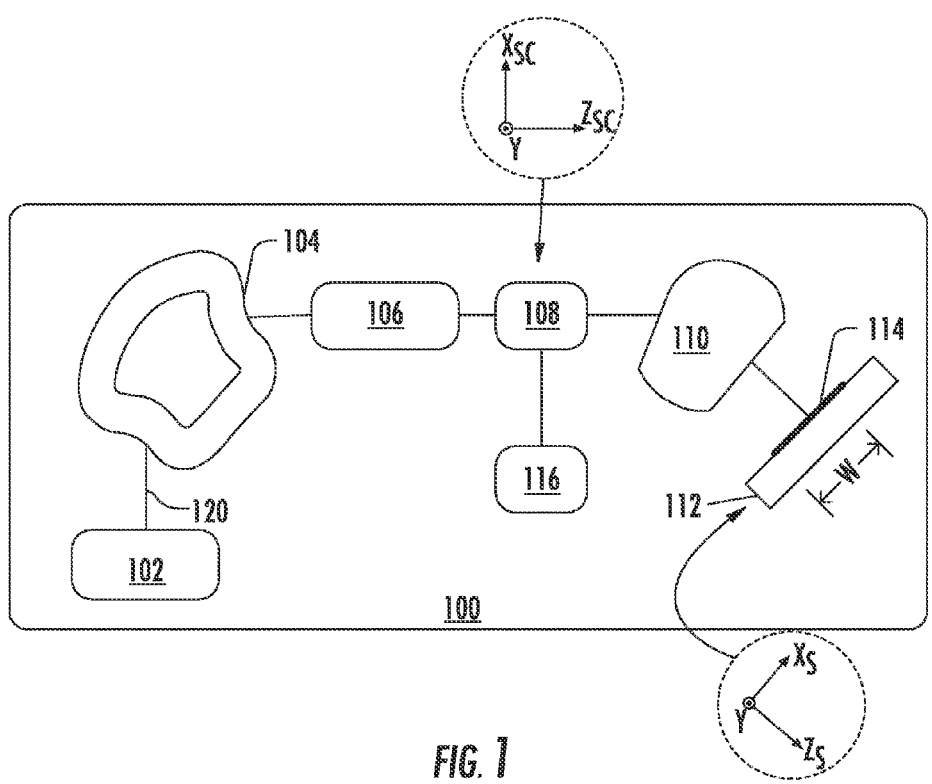
FIG. 1 depicts a top plan view in block form of a ion implanter according to the present embodiments.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The embodiments described herein provide a novel dual stage scanner to perform scanning of an ion beam. The dual stage scanner may be used to scan the ion beam into a fan shape that has a range of ion trajectories that are received by a collimator, while at the same time establishing a common focal point of the scanned ion beam that lies outside the dual stage scanner. In particular, as detailed herein, the dual stage scanner provides a novel apparatus and operation principle that allows the focal point to be set at a desired location upstream to the dual stage scanner, such as at a plane of the mass resolving slit of a beamline ion implanter. The present embodiments facilitate, among other things, the ability to operate a beamline ion implanter in both a ribbon beam and spot beam mode without extensive reconfiguration between operating modes. In addition, the present embodiments provide a new "control knob" to adjust the location of the focal point of a scanned ion beam as desired.

The term "focal point" refers to a point at which a plurality of non-parallel ion trajectories converge or appear to converge. As detailed below, to a collimator the focal point of a scanned spot beam produced by a dual stage scanner may appear as a source of the scanned spot beam that lies upstream of the dual stage scanner. However, as detailed below, and in accordance the present embodiments, such a source is a virtual source. This is because the ion trajectories of the scanned ions do not fan out until passing through the dual stage scanner which lies downstream of this virtual source. In some embodiments, the dual stage scanner may be configured to place the focal point of scanned ions at an object point of a collimator that receive the scanned spot beam. In this manner, the scanned spot beam may mimic geometry of a ribbon beam that has its focus at the object point of the collimator. Accordingly, an ion implanter that employs the dual stage scanner may generate a same or similar beam geometry as received by the collimator whether operating in a ribbon beam or spot beam mode.

FIG. 1 depicts a top plan view in block form of an ion implanter 100 according to the present embodiments. The ion implanter 100 includes an ion source 102 used to generate ions, analyzer magnet 104, vacuum chamber 106, dual stage scanner 108, collimator 110, and substrate stage 112. The ion implanter 100 is configured to generate an ion beam 120 and deliver the ion beam 120 to a substrate 114. For simplicity, the ion beam 120 is depicted merely as a central ray trajectory of the ion beam. In various embodiments, the ion source 102 may be an indirectly heated cathode (IHC) ion source, an RF ion source, a microwave ion source or other ion source. The analyzer magnet 104 may alter the trajectory of ions extracted from the ion source 102 as in conventional analyzer magnets. The vacuum chamber 106 may include a mass resolving slit (not shown in FIG. 1) which may function as a conventional mass resolving slit to screen out ions of undesired mass. In various embodiments the dual stage scanner 108 may be a magnetic scanner or an electrostatic scanner. The collimator 110 may be a magnetic collimator that functions at least to generate a collimated ion beam to be conducted to the substrate 114. The ion implanter 100 may include other beamline components including apertures, dithering components, acceleration/deceleration lenses, each of whose operation is well known. For clarity, further discussion of such components is omitted herein.

As further illustrated in FIG. 1 the ion implanter 100 includes a scan controller 116 whose function is to control scanning of an ion beam 120. Further details of operation of the scan controller 116 and similar scan controllers are disclosed with respect to the figures to follow. However, in brief, the scan controller 116 may send signals to the two stages of the dual stage scanner 108 to that generate of extinguish deflection fields within the dual stage scanner 108. The scan controller 116 may also send signals to adjust deflection fields in both stages of the dual stage scanner 108 in a manner that sets a focal point of the scanned ion beam 120 outside of the dual stage scanner. The scan controller 116 may comprise one or more hardware elements as well as software elements, such as switches, circuits, power supplies, computer programs or routines, user interfaces, and the like.

For convenience in the discussion to follow, different coordinate systems are employed to describe operation of the present embodiments as shown in FIG. 1. At the dual stage scanner 108 a first Cartesian coordinate system whose components are labeled Y, Xsc, and Zsc, is used. At the substrate 114 a second Cartesian coordinate system whose components are labeled Y, Xs, and Zs, is used. In each coordinate system, the Y-axis is parallel to the same absolute direction. The Z-axis for the different coordinate systems is in each case along the direction of central ray trajectory of ion beam propagation at a particular point. Thus, the absolute direction of the Zsc axis differs from that of the Zs axis. Similarly Xsc differs from Xs.

In some embodiments, the ion implanter 100 may operate in both ribbon beam and spot beam modes. In various embodiments, the ribbon beam may have a relatively smaller aspect ratio defined by a ratio of ion beam height along a direction parallel to the Y-axis to ion beam width along a direction parallel to the Xsc axis. For a ribbon beam this ratio may be less than one third and is in some examples less than one tenth. For example, a ribbon beam provided to the substrate 114 whose ions have trajectories along the Zs axis may have a width along the Xs axis of 300 to 400 mm and a height along the Y axis of 20 mm at the substrate 114, yielding an aspect ratio of less than 0.1. The embodiments are not limited in this context. In various embodiments, the spot beam may have a relatively larger aspect ratio such as greater than ½ and in some cases greater than one. For example, a spot beam provided to the substrate 114 may have a width along the Xs axis of 20 mm and a height along the Y axis of 30 mm. The embodiments are not limited in this context. It is to be noted that the aforementioned spot beam dimensions apply to the instantaneous dimension of a spot beam, and that the overall treatment area of a scanned spot beam may be the same or similar to that of a ribbon beam.

Because the ion implanter 100 may operate in either ribbon beam mode or spot beam mode, the ion implanter 100 provides convenience and process flexibility for processing substrates when a succession of implantation operations for a set of substrates or for different sets of substrates may require different implantation modes. This avoids the requirement to direct substrates to be processed by ribbon beam ion implantation or spot beam ion implantation to a respective ion implanter dedicated for ribbon beam or spot beam implantation.

When a ribbon beam mode is set for the ion implanter 100 a ribbon beam may be generated at the ion source 102 and focused at an MRS (not shown) provided in the vacuum chamber 106. In ribbon beam mode the dual stage scanner 108 may remain inactive or the scan controller 116 may deactivate any scan signals from being sent to the dual stage scanner 108. In this manner the dual stage scanner may transmit the ribbon beam unperturbed. The ribbon beam may then fan out as it propagates into the collimator 110. The collimator 110 may be adjusted to provide collimation to such a ribbon beam. As such the collimator 110 may be set to collimate a beam having a focal point at the MRS.

In the present embodiments, ion implanter 100 may also be operated in spot beam mode, which entails activating the dual stage scanner 108 so that a spot beam emerging from the vacuum chamber 106 is scanned such that the ion trajectories fan out over a range of angles before entering the collimator 110. Consistent with the present embodiments, and as detailed below, the dual stage scanner 108 may be set to scan a spot beam in a manner that creates a virtual source of the spot beam at an MRS within the vacuum chamber 106. This allows the ion implanter 100 to be operated in spot beam mode without reconfiguration of the collimator 110, since the spot beam may appear to emanate from the same position as a ribbon beam generated when the ion implanter is operated in ribbon beam mode. As detailed below, this is accomplished by the manner in which the dual stage scanner generates a first oscillating deflection signal in a first scanner stage and a second oscillating deflection signal in a second scanner stage. These oscillating deflection signals are synchronized so that in concert they produce respective first and second oscillating deflection fields that alter ion trajectories when a spot beam is scanned through the dual stage scanner 108 in a manner that creates a virtual source at an appropriate location such as the mass resolving slit.

Figure 2:
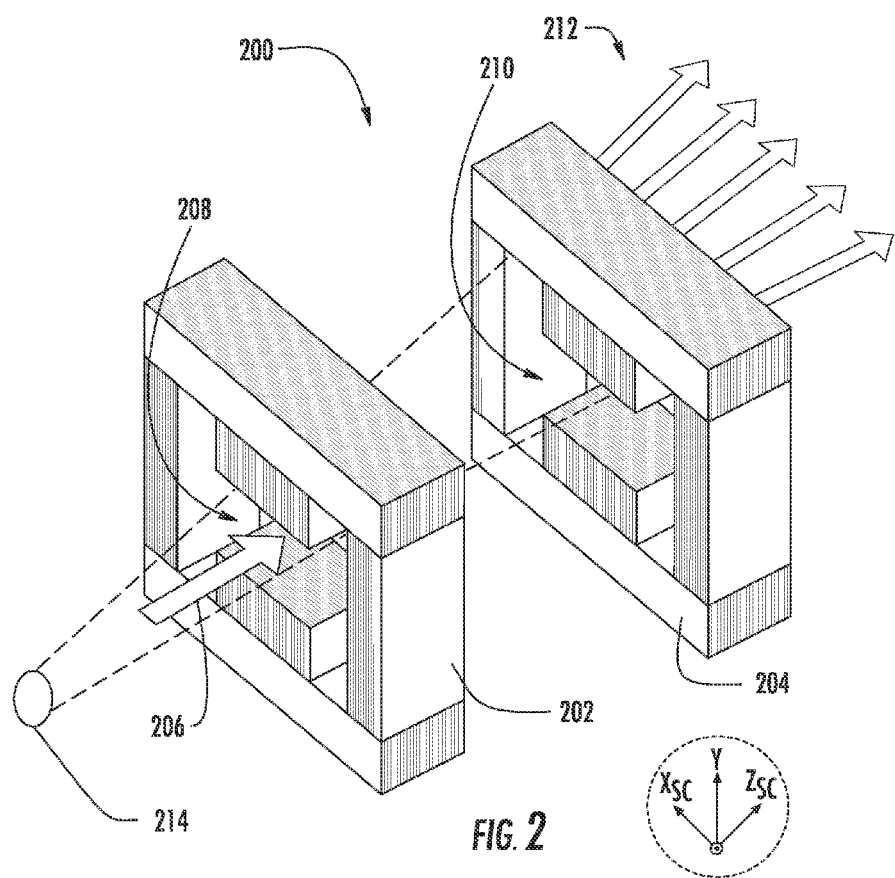
FIG. 2 depicts a top isometric view of a dual stage scanner consistent with various embodiments.

FIG. 2 depicts an isometric top view of a dual stage scanner 200 consistent with various embodiments. In the example shown in FIG. 2 the dual stage scanner 200 includes a first scanner stage 202 and a second scanner stage 204 disposed downstream from the first scanner stage. The second scanner stage 204 is "downstream" of the first scanner stage 202 in that the ion beam 206 enters the first scanner stage 202 before entering the second scanner stage 204 as it propagates towards a substrate (not shown). For clarity several components of each scanner stage of the dual stage scanner 200 are removed in the example of FIG. 2. Details of an exemplary scanner stage are provided in FIG. 4 discussed below.

The dual stage scanner 200 is configured to accept an ion beam 206 that travels generally in the direction to the right as indicated by the arrow. In the example shown in FIG. 2, the dual stage scanner 200 is a magnetic scanner that generates a set of deflecting fields that exert a force on the ion beam 206 along the Xsc axis so as to change the trajectory of an ion in the ion beam 206, trajectory may lie along the Zsc axis before entering the dual stage scanner 200. In particular, as discussed below, the first scanner stage 202 is configured to generate a first oscillating deflecting field within the region 208 through which the ion beam 206 may travel. The second scanner stage 204 is configured to generate a second oscillating deflecting field in the region 210 that is also configured to transmit the ion beam 206. Each of these oscillating deflecting fields is time dependent such that the strength and direction of a respective oscillating deflecting field varies over time, with a result that the a series of deflected ion beams 212 exit the dual stage scanner 200 over a range of trajectories as shown in FIG. 2.

As explained further below the first scanner stage and second scanner stage of a dual stage scanner may act in concert to generate a series of ion beam trajectories that exit the dual stage scanner as generally shown in FIG. 2, where the ion beam trajectories appear to originate from a common focal point as shown by the virtual source 214 at a location that is upstream of the dual stage scanner.

Figure 3A:
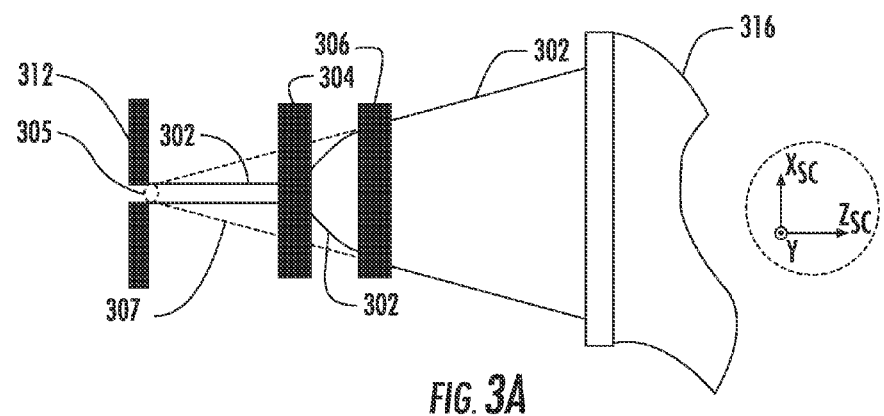
FIG. 3A depicts the general relationship between an exemplary dual stage scanner and ion beam shape.
Figure 3B:
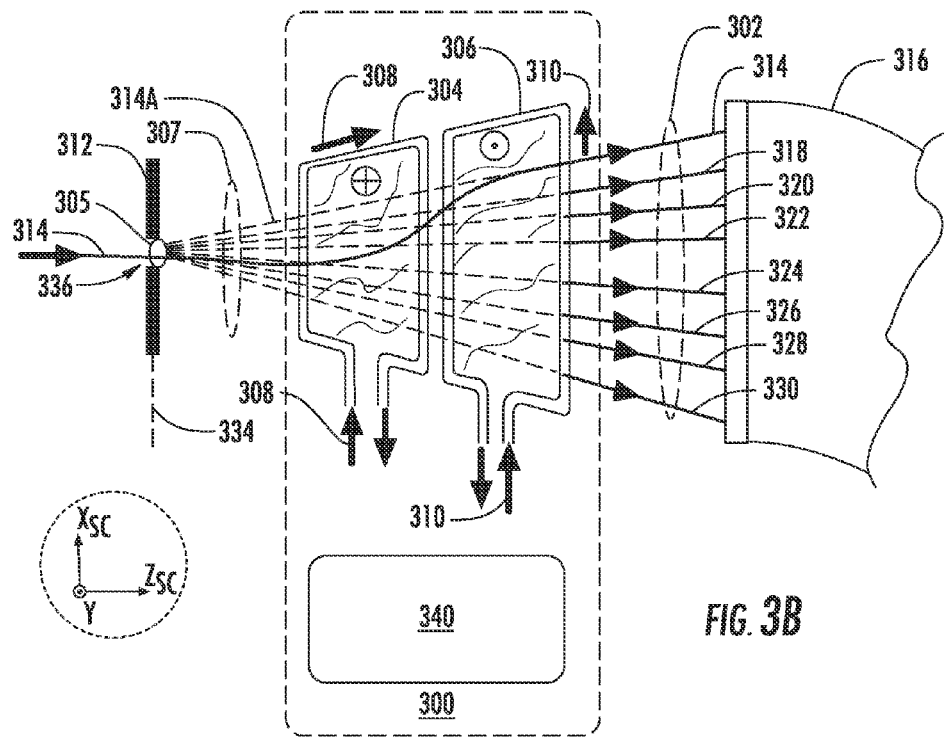
FIG. 3B depicts in schematic form the geometrical relationship of dual stage scanner and real and projected ion trajectories in accordance with some embodiments.

FIG. 3A and FIG. 3B depict operation of a dual stage scanner system 300 that illustrate principles of operation of various embodiments. In particular, FIGS. 3A and 3B depict one example of the manner that two stages of a dual stage scanner act in concert to generate a virtual source 305 that lies outside the dual stage scanner. The view presented in FIGS. 3A and 3B is parallel to the Xsc-Zsc plane for the Cartesian coordinate system shown. As illustrated a portion of an ion implanter is shown in relation to a first scanner stage 304 and second scanner stage 306 of a dual stage scanner system 300. The view presented in FIG. 3A shows general features of the geometry associated with scanning a spot beam, while FIG. 3B depicts additional details of the geometry of ion trajectories produced by the dual stage scanner. For clarity of illustration, in FIG. 3B the orientation of the first scanner stage 304 and second scanner stage 306 is partially rotated around an axis along the Zsc axis in comparison to their actual positions. Moreover, the scanner stages depicted in FIGS. 3A and 3B are schematic and omit details of components of a scanner stage, which are provided below for an exemplary scanner stage with respect to FIG. 4.

Turning now to FIG. 3A, an ion beam envelope 302 is shown in solid lines that illustrates the space occupied by a spot ion beam as it propagates from a mass resolving slit 312 through the first scanner stage 304 and second scanner stage 306 to a collimator 316. The ion beam envelope 302 represents the trajectories and positions of ions over time as a spot beam is scanned using the dual stage scanner system 300. In some embodiments, a spot beam may be scanned back and forth at a rate of 10s of Hz to thousands of Hz. Before entering the first scanner stage 304, the ion beam envelop 302 defines a narrow spot beam where ions have trajectories parallel to Zsc. The trajectories then fan out as shown such that the ion beam envelope 302 is wide when it intercepts the collimator 316.

Notably, although the ion beam envelope 302 does not expand until it reaches the first scanner stage 304, the ion beam trajectories that fan out from the second scanner stage 306 to be intercepted by the collimator 316 appear to originate from a virtual source 305 as defined by the virtual envelope 307 shown in dotted lines.

Turning now to FIG. 3B there are shown details of operation of the dual stage scanner system 300. In FIG. 3B the first scanner stage 304 and second scanner stage 306 may be magnetic scanners that each generate a magnetic field that provides a deflecting force to an ion beam passing through the dual stage scanner system 300. In the present embodiments, the first scanner stage 304 and second scanner stage 306 are each configured to generate a oscillating magnetic field responsive to a time-varying signal, such as an oscillating electric current that travels in a loop and generates a magnetic field. For clarity of illustration, the first scanner stage 304 and second scanner stage 306 are merely represented by electric current-carrying loops. In particular, the first scanner stage 304 and second scanner stage 306 are configured to generate an electric current that varies in strength and direction with time. Examples of such currents include a sinusoidally varying electric current, an oscillating electric current having a triangular or sawtooth variation of current over time (waveform), or a composite-shaped oscillating electric current.

In the embodiment of FIGS. 3A and 3B the shape and orientation of the electric current loops of the first scanner stage 304 and second scanner stage 306 are arranged such that respective magnetic fields generated by oscillating electric currents create oscillating deflecting forces that act along the Xsc axis. Accordingly when an ion beam traverses the dual stage scanner system 300 the ion beam is subject to an oscillating deflecting force along the Xsc axis from both the first scanner stage 304 and second scanner stage 306. At any given instant, depending upon the magnitude and direction of the deflecting forces generated by the first scanner stage 304 and second scanner stage 306, an ion beam may be deflected to a greater or lesser extent from its initial trajectory. Over the duration of one oscillation cycle or multiple oscillation cycles the dual stage scanner system 300 may generate the ion beam envelope 302 as shown.

One notable feature provided by the dual stage scanner of the present embodiments is the synchronization or alignment of the oscillating deflecting fields generated by the first and second scanner stages. In FIG. 3B, a scan controller 340 is provided to align the electric current signal 308, which represents oscillating electric current of a given oscillation cycle provided to the first scanner stage 304, with an electric current signal 310, which represents an oscillating electric current of the given oscillation period provided to the second scanner stage 306. The alignment is such that the waveform of the electric current signal 308 exhibits a 180 degree phase offset with respect to that of the electric current signal 310. In this manner, at any given instant an ion beam traversing the dual stage scanner system 300 is subject to deflecting forces that act in opposite directions, except when the respective electric current signals 308, 310 are both zero.

In FIG. 3B, the trajectory of a single ion beam 314 is shown as a solid line, which may represent the trajectory of a spot beam at a particular instance in time. As shown, the ion beam 314 has a trajectory that is parallel to the Zsc axis during propagation of the ion beam 314 through the mass resolving slit 312 until it reaches the first scanner stage 304. At this point the ion beam is deflected towards the left in the example shown, and subsequently towards the right as it passes through the second scanner stage 306. The overall ion beam path forms a "dog-leg" shape after the ion beam 314 exits the second scanner stage 306. This overall trajectory is the result of the instantaneous generation of a first deflecting force from first scanner stage 304 that acts upwardly in FIG. 3B along the Xsc axis, and a second deflecting force from the second scanner stage 306 that acts downwardly along the Xsc axis. These forces are generated in turn by the respective electric current signal 308 which travels in a clockwise fashion, and the electric current signal 310 which travels in a counter-clockwise fashion in the instance shown in FIG. 3B. The relative magnitude of the deflecting forces is arranged so that the final ion beam trajectory of ion beam 314 as it enters the collimator 316 can be linearly projected back to the virtual source 305 located at the aperture 336 of mass resolving slit 312, as illustrated by the apparent trajectory 314A. The final ion beam trajectory represents a trajectory of the ion beam after leaving the dual stage scanner where no further deflecting forces are experienced resulting in the final trajectory defining a straight line.

At other instances in time, the magnitude and direction of deflecting forces produced by the first scanner stage 304 and second scanner stage 306 vary in concert with one another such that other final ion beam trajectories are generated. In FIG. 3B a series of additional solid lines represent the final ion beam trajectories 318, 320, 322, 324, 326, 328, and 330 of ion beams produced at other instances in time over a scan cycle, which collectively form the ion beam envelope 302. Each of these final ion beam trajectories defines a respective line that projects back (upstream) to the aperture 336 of mass resolving slit 312 to collectively form the virtual source 305, meaning that a straight line drawn through each final ion beam trajectory intercepts the aperture 336 at the plane 334 of the mass resolving slit 312. Thus, from the perspective of collimator 316, the ions that travel along the final ion beam trajectories 318, 320, 322, 324, 326, 328, and 330 appear to diverge from the virtual source 305. For clarity, the actual trajectories of ion beams corresponding to the final ion beam trajectories 318-330 are not shown, but it may be understood that each trajectory may have a dog leg shape similar to that of ion beam 314 while traversing the dual stage scanner system 300.

Figure 3C:
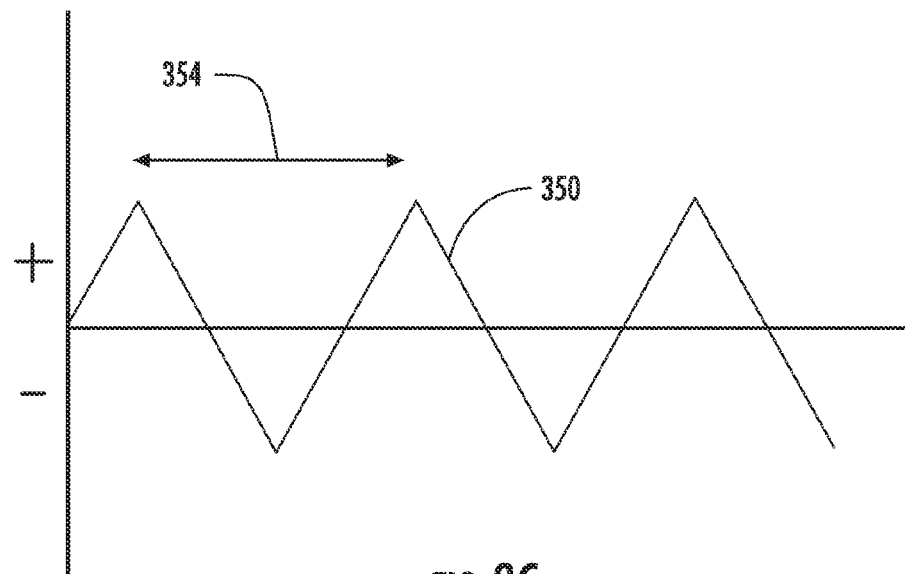
FIGS. 3C and 3D depict exemplary oscillating deflection signals.
Figure 3D:
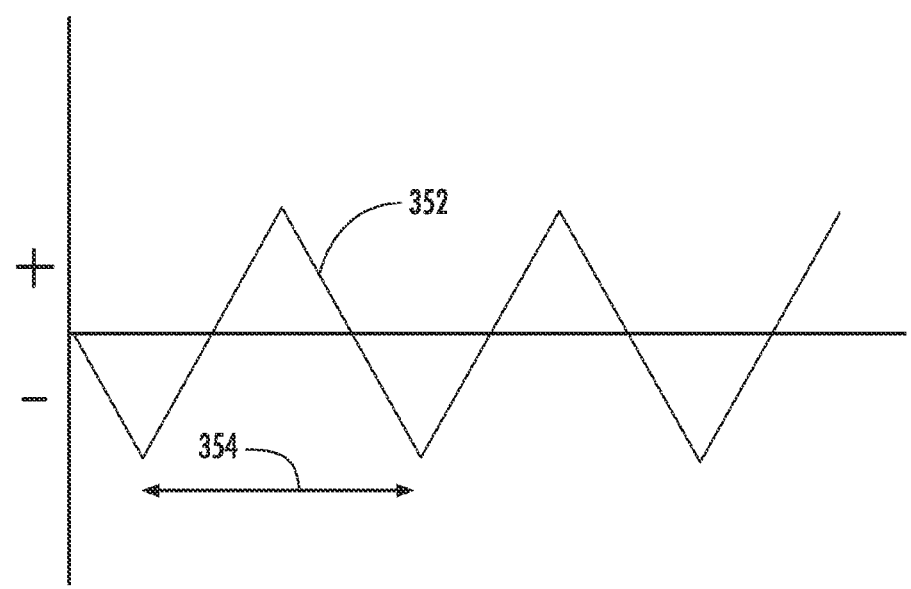

FIGS. 3C and 3D depict exemplary oscillating deflection signals 350, 352 that may be sent to the respective first scanner stage 304 and second scanner stage 306 to generate oscillating deflection fields. As illustrated the oscillating deflection signals 350, 352 share a common oscillation period 354. However, the oscillating deflection signals 350, 352 have a 180 degree phase offset such that when the oscillating deflection signal 350 is positive the oscillating deflection signal 352 is negative, and vice versa. Moreover, a positive peak in one oscillating deflection signal 350, 352 corresponds to a negative peak in the other oscillating deflection signal 352, 350.

It is to be noted, that although the oscillation period of oscillating current signals conducted within the first scanner stage 304 and second scanner stage 306 may be equal and while their relative phase offset may be 180 degrees, the amplitude of oscillating electric current signals need not be equal. Thereby the magnitude of electric currents conducted within the first scanner stage 304 and second scanner stage 306 at any given time need not be equal. Rather, the relative amplitudes of the respective oscillating current signals may be set so that the final ion beam trajectories project back to the plane of the mass resolving slit 312 for all ion beam trajectories, regardless of the relative current amplitudes in the first scanner stage 304 and second scanner stage 306.

Figure 4:
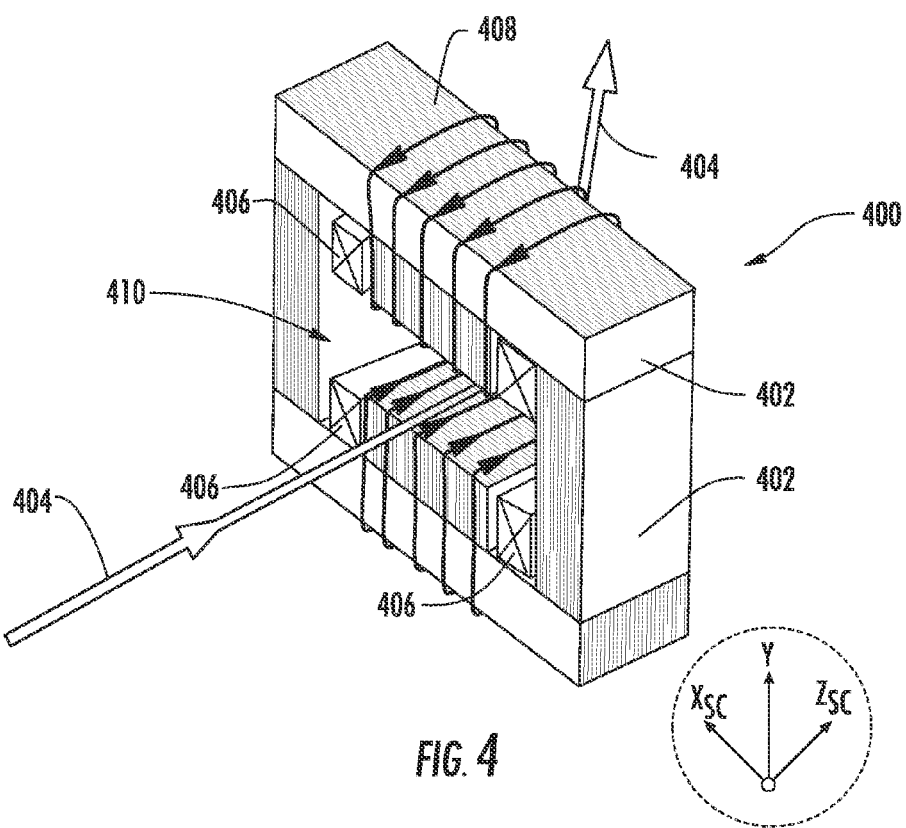
FIG. 4 presents details of a magnetic scanner stage according to various embodiments.

FIG. 4 provides further details of a scanner stage 400 consistent with various embodiments. The scanner stage 400 may be used either as a first or second scanner stage in a dual stage scanner. The scanner stage 400 is a magnetic scanner in which the scanner body 402 may be composed of thin silicon steel sheets such as 0.5 mm thick sheets. A set of high current windings 406 are provided to act as scanning coils to generate an oscillating magnetic field to be used as a deflecting field to deflect an ion beam 404. In particular, the high current windings 406 are coupled to a current source that may generate an electric current that oscillates in polarity as discussed above with respect to FIGS. 3A, 3B. This serves to generate the oscillating magnetic field within a gap defined by the opening 410 that transmits the ion beam 404. In order to provide the appropriate deflection force in the opening 410 the current conducted through the high current windings 406 may be controlled using drive circuitry which may incorporate elements of conventional drive circuitry used to drive magnetic scanners.

Moreover, as further shown in FIG. 4, a set of zero-field effect avoidance windings are provided that wrap around a portion of the scanner body 402. These may act as secondary coils to produce a secondary magnetic field superimposed on the main oscillatory magnetic field component, which acts to substantially eliminate fluctuations in the beam size of ion beam 404.

In addition, a scan controller such as scan controller 340 may synchronize an oscillating current conducted through the high current windings 406 of scanner stage 400 with that of a like scanner stage so that a phase offset exists between the two scanner stages to produce the desired final ion trajectory of the ion beam 404 as discussed above with respect to FIGS. 3A, 3B.

Figure 5A:
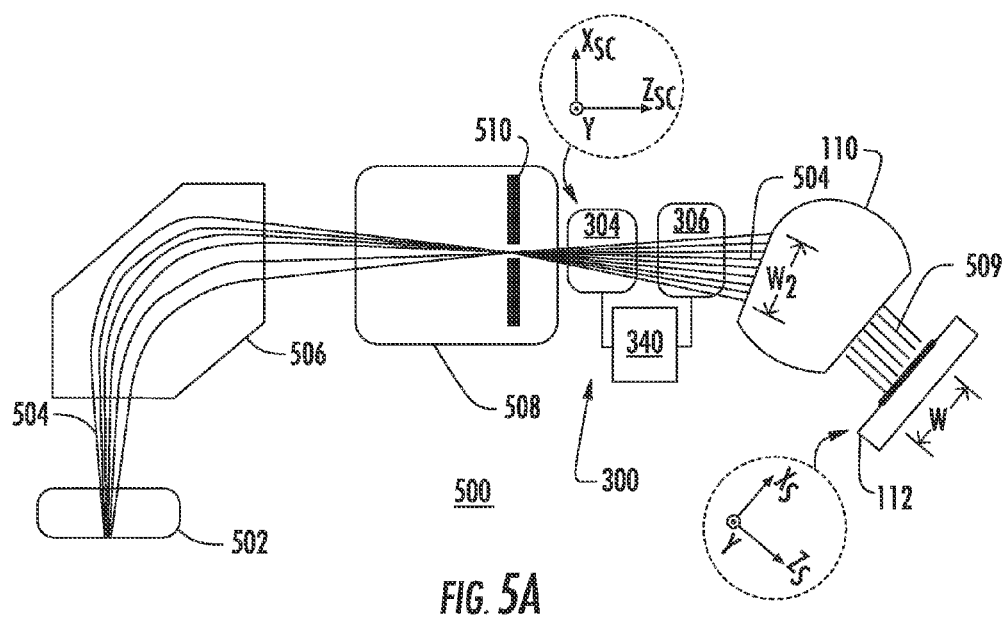
FIGS. 5A and 5B depicts a top plan view in block form of another embodiment of an ion implanter operating is ribbon beam and spot beam modes, respectively.
Figure 5B:
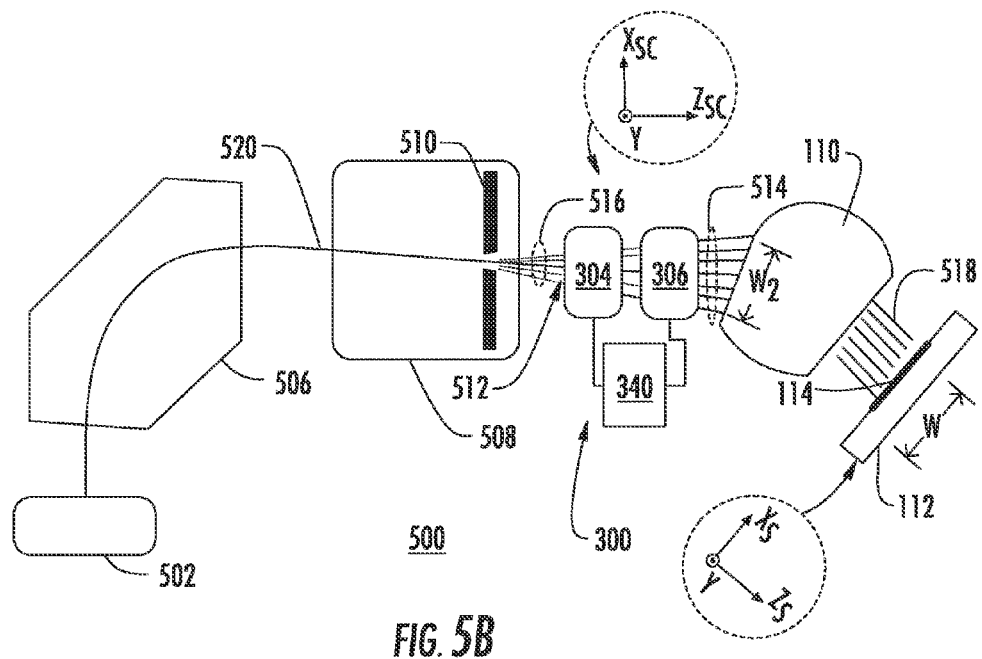

FIGS. 5A and 5B depicts operation of an ion implanter 500 consistent with further embodiments. In this case, the ion implanter 500 may have similar components as the ion implanter 100. The ion implanter 500 includes an ion source 502, analyzer magnet 506, vacuum chamber 508 that includes a mass resolving slit 510, dual stage scanner system 300, including scan controller 340, collimator 110, and substrate stage 112. The ion implanter 500 is operative to generate a spot ion beam or ribbon ion beam at the mass resolving slit 510. This provides the advantages that both modes of ion beam are produced within a single ion implanter. The switching between ribbon beam and spot beam operation may take place by changing ion sources or using other components to change the shape of an ion beam before entering the mass resolving slit. However, in order to reduce the complexity and time from switching between ribbon beam and spot beam modes, it may be desirable to avoid reconfiguration of the collimator 110 as noted previously. This is accomplished by the dual stage scanner system 300.

In FIG. 5A there is shown a scenario of operation of the ion implanter in ribbon beam mode in which the ion source 502 generates a ribbon beam 504. The ribbon beam 504 propagates through the ion implanter 500 where it is focused at the mass resolving slit 510 and conducted to the collimator 110. In this scenario the dual stage scanner system 300 is not active and merely transmits the ribbon beam 504. In FIG. 5B, the ion implanter generates a spot beam 520, which is conducted to the mass resolving slit 510. Although the ion source 502 is shown as generating the spot beam 520, in some instances a different ion source may be used to generate the spot beam 520. In any case, in the example shown in FIG. 5B the collimator 110 may be configured as in the scenario of FIG. 5A so that its collimating components are set to collimate a diverging set of ions that emanates from a source at the mass resolving slit 510. As previously discussed, when a spot beam is conducted through a mass resolving slit 510, the spot beam is not scanned into a fan shape until entering a scanner that is disposed downstream. Thus, the spot beam 520 remains as a narrow beam of parallel ion trajectories until entering the dual stage scanner system 300 at point 512. The spot beam 520 may be scanned as described above with respect to FIGS. 3A and 3B. A set of ion beams 514 that exit the second scanner stage 306 are generated over time in a fan shape that enters the collimator 110. The ion trajectories of the ion beams 514 are such that they project linearly back as a virtual envelope 516 to a focal point that defines a virtual source (not separately shown) that is located at the mass resolving slit 510. Accordingly, since the collimator 110 is configured to collimate a diverging ion beam emanating from the mass resolving slit 510, collimator 110 may properly collimate ion beams 514 to produce a collimated ion beam 518 at the substrate 114 without adjustment to the collimator 110.

In particular embodiments, when operating in spot beam mode, the dual stage scanner system 300 may be configured so that the on beams 514, in addition to appearing to emanate from a virtual source at the mass resolving slit 510, also define the same width $W_2$ at the entrance to the collimator 110 as that of the ribbon beam 504. In this manner, a scanned spot beam may appear to collimator 110 to define the same geometry as that of a ribbon beam, therefore facilitating the ability to generate the same width W in the collimated ion beam 518 and collimated ion beam 509.

Although the aforementioned embodiments have provided details of magnetic scanners, the present embodiments include dual scan stage electrostatic scanners. In these latter embodiments, a first electrostatic scan stage and second electrostatic scanner stage may each include opposing plates that define an electrostatic field therebetween when an electric potential is applied to the opposing plates. The first and second electrostatic scanner stages may be driven with oscillating voltage signals that are 180 degrees out of phase in order to generate final ion trajectories in a scanned ion beam that define a virtual source upstream of the actual electrostatic scanner stages, such as in the plane of a mass resolving slit.

Moreover, in some embodiments, a dual stage scanner may be configured to generate the appropriate deflection signals to produce a scanned ion beam that has a virtual source located at any desired position upstream of the dual stage scanner. This may be accomplished by appropriate choice of amplitude of signals provided to the scanner stages, gaps between components of a scanner stage, separation of scanner stages. In various embodiments, for a given configuration of scanner stages, control circuitry such as a scan controller may be used to set the relative signal strengths supplied to the scanner stages in order to adjust the position of a virtual source.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An ion beam scanner, comprising:
a first scanner stage having a first opening to transmit an ion beam received from a mass resolving slit in a ribbon beam mode and in a spot beam mode, wherein in the spot beam mode the first scanner stage is configured to generate, responsive to a first oscillating deflection signal, a first oscillating deflecting field within the first opening, wherein the mass resolving slit forms a focal point of a ribbon beam in the ribbon beam mode;
a second scanner stage disposed downstream of the first scanner stage and having a second opening to transmit the ion beam in the ribbon beam mode and in the spot beam mode, wherein in the spot beam mode the second scanner stage is configured to generate, responsive to a second oscillating deflection signal, a second oscillating deflecting field within the second opening that is opposite in direction to the first oscillating deflecting field;
a collimator disposed downstream of the second scanner stage; and
a scan controller to synchronize the first oscillating deflection signal and second oscillating deflection signal to generate a plurality of ion trajectories when the scanned ion beam exits the second stage that define a common focal point, wherein in the spot beam mode, the common focal point is sufficiently close to the mass resolving slit such that the ion beam scanner may be operated in the spot beam mode and the ribbon beam mode without reconfiguration of the collimator.

2. The ion beam scanner of claim 1, wherein the first oscillating deflecting field and the second oscillating deflecting field lie along a first direction that is perpendicular to a direction of propagation of the ion beam at the first scanner stage.

3. The ion beam scanner of claim 1, wherein the first and second scanner stages are magnetic scanners.

4. The ion beam scanner of claim 3, wherein the first oscillating deflection signal is a first oscillating electric current having a first oscillation period to generate a first oscillating magnetic field, wherein the second oscillating deflection signal is a second oscillating electric current having the first oscillation period to generate a second oscillating magnetic field, and wherein the scan controller is operative to synchronize the first and second oscillating electric currents such that the first oscillating current exhibits a 180 degrees phase offset from the second oscillating current.

5. The ion beam scanner of claim 1, wherein the first and second scanner stage are operative to generate a dog leg shaped trajectory to a plurality of the ion trajectories, wherein the ion trajectories converge at a virtual source in the common focal point.

6. The ion beam scanner of claim 1, wherein the scan controller is operative to vary a position of the focal point.

7. The ion beam scanner of claim 1, wherein the common focal point lies upstream of the first scanner stage.

8. The ion beam scanner of claim 1, wherein the ion beam is a spot ion beam in the spot beam mode.

9. An ion implanter, comprising:
an ion source;
beamline components to generate a spot ion beam;
a mass resolving slit; and
a dual stage scanner system disposed downstream of the mass resolving slit and operative to scan the spot ion beam over a plurality of ion trajectories to generate a scanned ion beam, wherein the dual stage scanner system is operative to generate a first oscillating deflecting field at a first scanner stage that has a first opening to transmit an ion beam in a ribbon beam mode and in a spot beam mode, and a second oscillating deflecting field at a second scanner stage that is opposite in direction to the first oscillating deflecting field, the second scanner stage having a second opening to transmit the ion beam in a ribbon beam mode and a spot beam mode, wherein the mass resolving slit forms a focal point of a ribbon beam in the ribbon beam mode, wherein the plurality of ion trajectories define a plurality of lines that converge at a focal point that is disposed upstream of the dual stage scanner system; and
a collimator located downstream of the dual stage scanner system;
wherein the dual stage scanner system is configured to switch from the spot beam mode in which the dual stage scanner system scans the spot beam, and the ribbon beam mode, and wherein in the spot beam mode, the focal point is sufficiently close to the mass resolving slit such that the ion beam scanner may be operated in the spot beam mode and the ribbon beam mode without reconfiguration of the collimator.

10. The ion implanter of claim 9, wherein the focal point is located at the mass resolving slit.

11. The ion implanter of claim 9, wherein the collimator is located downstream of the dual stage scanner system and configured to receive the scanned ion beam and generate a collimated ion beam therefrom, wherein the focal point is located at an object point of the collimator.

12. The ion implanter of claim 9, wherein the first oscillating deflecting field and the second oscillating deflecting field lie along a first direction that is perpendicular to a direction of propagation of the ion beam at the first scanner stage.

13. The ion implanter of claim 9, wherein the first and second scanner stages are magnetic scanners.

14. The ion implanter of claim 9 wherein the dual stage scanner system comprises a scan controller configured to:
output a first and second oscillating deflection signal that generate the respective first and second oscillating deflection fields; and
synchronize the first oscillating deflection signal and second oscillating deflection signal to generate the plurality of ion trajectories.

15. The ion implanter of claim 14 wherein the scan controller is operative to generate a 180 degree phase offset between the first and second oscillating deflection signals.

16. A method of controlling a spot ion beam in a beamline ion implanter, comprising;
generating in a spot beam mode a first oscillating deflecting field along a first direction perpendicular to a direction of propagation of the spot ion beam when the spot ion beam passes through a first region;
generating in the spot beam mode a second oscillating deflecting field along the first direction when the spot ion beam passes through a second region downstream to the first region, wherein the first and second oscillating deflecting fields are interoperative to fan the spot ion beam out over a plurality of trajectories that are not parallel to the direction of propagation of the spot ion beam, and wherein the plurality of trajectories have a common focal point;
switching from the spot beam mode to a ribbon beam mode; and
in the ribbon beam mode, transmitting unperturbed the ion beam as a ribbon beam through the first region and the second region, wherein in the spot beam mode, the common focal point is sufficiently close to a mass resolving slit that forms a focal point of the ribbon beam in the ribbon beam mode such that the ion beam scanner may be operated in the spot beam mode and the ribbon beam mode without reconfiguration of the collimator.

17. The method of claim 16, further comprising synchronizing the first and second oscillating deflecting fields wherein the first oscillating deflecting field exhibits a 180 degrees phase offset from the second oscillating deflecting field.

18. The method of claim 16, wherein the generating the first and second oscillating deflecting fields comprises generating a first and second oscillating magnetic field.

* * * * *